United States Patent
Oyaizu et al.

(10) Patent No.: US 8,044,570 B2
(45) Date of Patent: Oct. 25, 2011

(54) LIGHTING DEVICE COMPRISING A COLOR CONVERSION UNIT

(75) Inventors: Tsuyoshi Oyaizu, Yokohama (JP); Kozo Ogawa, Yokosuka (JP); Seiko Kawashima, Yokosuka (JP); Akiko Takahashi, Urayasu (JP); Haruki Takei, Kawasaki (JP); Erika Takenaka, Yokohama (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 0 days.

(21) Appl. No.: 12/581,911

(22) Filed: Oct. 20, 2009

(65) Prior Publication Data

US 2010/0096965 A1    Apr. 22, 2010

(30) Foreign Application Priority Data

Oct. 21, 2008  (JP) .................................. 2008-271329
Sep. 17, 2009  (JP) .................................. 2009-216143

(51) Int. Cl.
*H01L 51/00* (2006.01)
*H01L 51/50* (2006.01)
*H01L 51/52* (2006.01)
*H01L 51/54* (2006.01)

(52) U.S. Cl. .......... 313/501; 313/502; 313/503; 362/84; 362/293

(58) Field of Classification Search .......... 313/498–512; 362/84, 293
See application file for complete search history.

(56) References Cited

U.S. PATENT DOCUMENTS

| | | | | |
|---|---|---|---|---|
| 6,479,930 | B1 * | 11/2002 | Tanabe et al. | 313/509 |
| 7,615,921 | B2 * | 11/2009 | Kimura | 313/506 |
| 2005/0116619 | A1 * | 6/2005 | Kuma et al. | 313/503 |
| 2005/0248929 | A1 * | 11/2005 | Kawamura et al. | 362/84 |
| 2006/0124920 | A1 * | 6/2006 | Kimura | 257/40 |
| 2006/0192483 | A1 * | 8/2006 | Nakanishi et al. | 313/504 |
| 2007/0023734 | A1 * | 2/2007 | Igarashi et al. | 252/301.4 S |
| 2007/0123135 | A1 * | 5/2007 | Yang et al. | 445/24 |
| 2007/0159043 | A1 * | 7/2007 | Kubota et al. | 313/110 |

(Continued)

FOREIGN PATENT DOCUMENTS

CN            1094657         11/2002

(Continued)

OTHER PUBLICATIONS

English language abstract of JP-2008-218238.

(Continued)

*Primary Examiner* — Nimeshkumar Patel
*Assistant Examiner* — Jose M Diaz
(74) *Attorney, Agent, or Firm* — DLA Piper LLP US

(57) ABSTRACT

A lighting device includes a printed wiring board, a plurality of light-emitting elements, a sealing member, and a color conversion unit, and an adhesive layer. The sealing member has light transmitting properties and seals the light-emitting elements mounted on the printed wiring board. The color conversion unit includes a cover member of light transmitting properties, and a fluorescent substance layer provided on the inner surface of the cover member. The adhesive layer has light-transmitting properties, and adheres the sealing member to the fluorescent substance layer of the color conversion unit in an airtight manner.

6 Claims, 5 Drawing Sheets

U.S. PATENT DOCUMENTS

| | | | |
|---|---|---|---|
| 2008/0129653 A1* | 6/2008 | Yamazaki | 345/55 |
| 2008/0137008 A1* | 6/2008 | Rogojevic et al. | 349/69 |
| 2008/0191620 A1 | 8/2008 | Moriyama et al. | |
| 2009/0045722 A1* | 2/2009 | Bai et al. | 313/504 |
| 2009/0058278 A1* | 3/2009 | Ushikubo et al. | 313/504 |
| 2009/0189516 A1* | 7/2009 | Kurata et al. | 313/504 |
| 2009/0212696 A1* | 8/2009 | Terao | 313/506 |
| 2009/0230853 A1* | 9/2009 | Kanai | 313/504 |
| 2010/0039023 A1* | 2/2010 | Rogojevic et al. | 313/504 |

FOREIGN PATENT DOCUMENTS

| | | |
|---|---|---|
| CN | 1934721 | 3/2007 |
| CN | 1945099 | 4/2007 |
| CN | 1992364 | 7/2007 |
| CN | 101084585 | 12/2007 |
| CN | 201003739 | 1/2008 |
| EP | 1 850 399 | 10/2007 |
| JP | 3-119573 | 12/1991 |
| JP | H05-152609 | 6/1993 |
| JP | 2002-057376 | 2/2002 |
| JP | 2003-068111 | 3/2003 |
| JP | 2004-193357 | 7/2004 |
| JP | 2008-147610 | 6/2008 |
| JP | 2008-218238 | 9/2008 |
| JP | 2008-227412 | 9/2008 |
| JP | 2010080117 A * | 4/2010 |

OTHER PUBLICATIONS

Machine English language translation of JP-2008-218238.
English language abstract of JP-2008-147610.
Machine English language translation of JP-2008-147610.
English language abstract of JP-2004-193357.
Machine English language translation of JP-2004-193357.
English language abstract of JP-2003-068111.
Machine English language translation of JP-2003-068111.
English language abstract of JP-3-119573.
English language abstract of JP-H05-152609.
Machine English language translation of JP-H05-152609.
Image File Wrapper of U.S. Appl. No. 12/634,710 electronically captured on Apr. 19, 2011.
Image File Wrapper of U.S. Appl. No. 12/641,841 electronically captured on Apr. 19, 2011.
English Language Abstract of JP 2008-227412 Published on Sep. 25, 2008.
English Language Translation of JP 2008-227412 Published on Sep. 25, 2008.
English Language Abstract of JP 2002-057376 Published on Feb. 22, 2002.
English Language Translation of JP 2002-057376 Published on Feb. 22, 2002.
Office Action issued in CN 200910179891 mailed Jan. 19, 2011.
English Language Abstract of CN 1094657 published Nov. 20, 2002.
Image File Wrapper of U.S. Appl. No. 13/045,787 electronically captured on Apr. 19, 2011.
Chinese Office Action issued in CN 200910261396.4 on Mar. 18, 2011.
English Translation of Chinese Office Action issued in CN 200910261396.4 on Mar. 18, 2011.
English Language Abstract of CN 101084585 published Dec. 5, 2007.
English Language Abstract of CN 1992364 published Jul. 4, 2007.
Chinese Office Action issued in CN 200910211992.1 on Dec. 31, 2010.
English Language Translation of Chinese Office Action issued in CN 200910211992.1 on Dec. 31, 2010.
English Language Abstract of CN 201003739 published on Jan. 9, 2008.
English Translation of CN 1945099 published Apr. 4, 2007.
Image File Wrapper of U.S. Appl 12/634,710 between May 26, 2011 and Aug. 26, 2011.

* cited by examiner

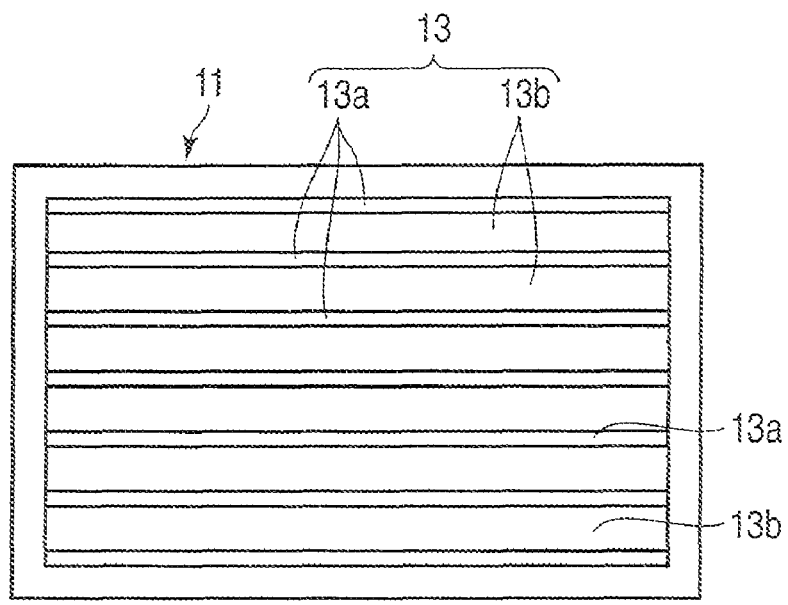
F I G. 4A
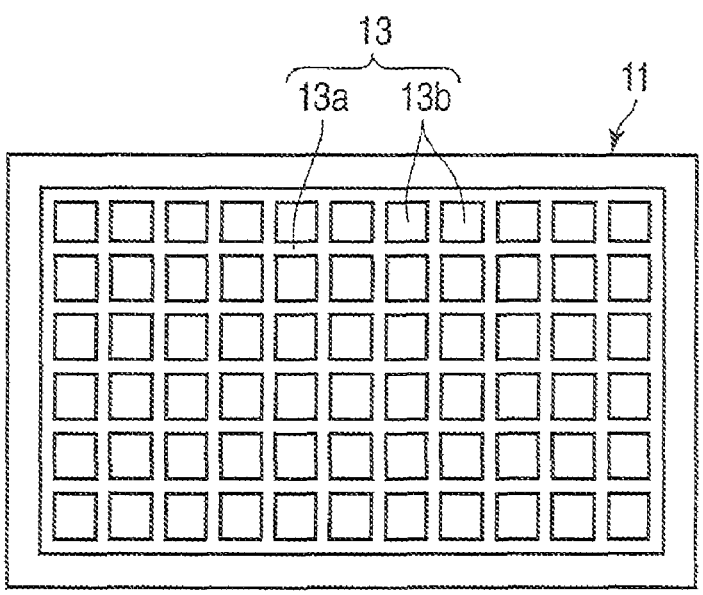
F I G. 4B

LIGHTING DEVICE COMPRISING A COLOR CONVERSION UNIT

CROSS-REFERENCE TO RELATED APPLICATIONS

This application is based upon and claims the benefit of priority from prior Japanese Patent Applications No. 2008-271329, filed Oct. 21, 2008; and No. 2009-216143, filed Sep. 17, 2009, the entire contents of both of which are incorporated herein by reference.

BACKGROUND OF THE INVENTION

1. Field of the Invention

The present invention relates to a lighting device in which blue or ultraviolet light is emitted from a light-emitting element, such as a light-emitting diode (LED), and excites fluorescent substances of different colors to produce light of different colors, so that by mixing the different colors, illumination light is emitted.

2. Description of the Related Art

Generally available LEDs have a structure in which an LED chip is encapsulated in transparent molded resin. An LED of this type is disclosed in, for example, Jpn. Pat. Appln. KOKAI Publication No. 5-152609. This LED is formed by mixing a yellow fluorescent substance (which is mainly excited by blue light to thereby mainly emit yellow light) into molded resin in which an LED chip capable of emitting blue light is sealed.

The disclosed LED emits white light of high color rendering properties by mixing the blue light emitted by the LED chip with the yellow light emitted by the yellow fluorescent substance excited by the blue light.

However, in the disclosed LED, since the molded resin has the double function of sealing the LED chip and acting as a fluorescent layer, if the material and thickness of the molded resin and the concentration of the yellow fluorescent substance are designed to optimize one of the functions, the other function may be less than optimal. For instance, if the LED chip is encapsulated in molded resin of an optimal thickness for preventing ingress of moisture or corrosive gases, the efficiency of color conversion (wavelength conversion) of the fluorescent layer may not be optimal.

Further, in the disclosed LED, since the yellow fluorescent substance is mixed into the molded resin, if defects occur in the yellow fluorescent substance or air bubbles occur in the molded resin, the LED must be rejected. In other words, the fact that the molded resin of the disclosed LED has a double function reduces product yield.

BRIEF SUMMARY OF THE INVENTION

It is an object of the invention to provide a lighting device in which an LED chip is reliably sealed, which exhibits desired color conversion performance, and which attains high product yield.

To attain the object, there is provided a lighting device comprising: a plurality of light-emitting elements configured to emit light of a preset color; a board with the light-emitting elements mounted thereon; a sealing member having a light transmitting properties and sealing the light-emitting elements on the board; and a color conversion unit including a cover member formed of light-transmitting materials, and a fluorescent substance layer provided on an inner surface of the cover member and having a transparent matrix containing a fluorescent substance dispersed therein, the fluorescent substance producing light of a color other than the preset color when being exited by the light of the preset color, the fluorescent substance layer being interposed between the inner surface of the cover member and the sealing member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4A is a schematic view illustrating the inner side of a color conversion unit example incorporated in the lighting device of FIG. 3;

FIG. 4B is a schematic view illustrating the inner side of another color conversion unit example incorporated in the lighting device of FIG. 3;

DETAILED DESCRIPTION OF THE INVENTION

Figure 1:
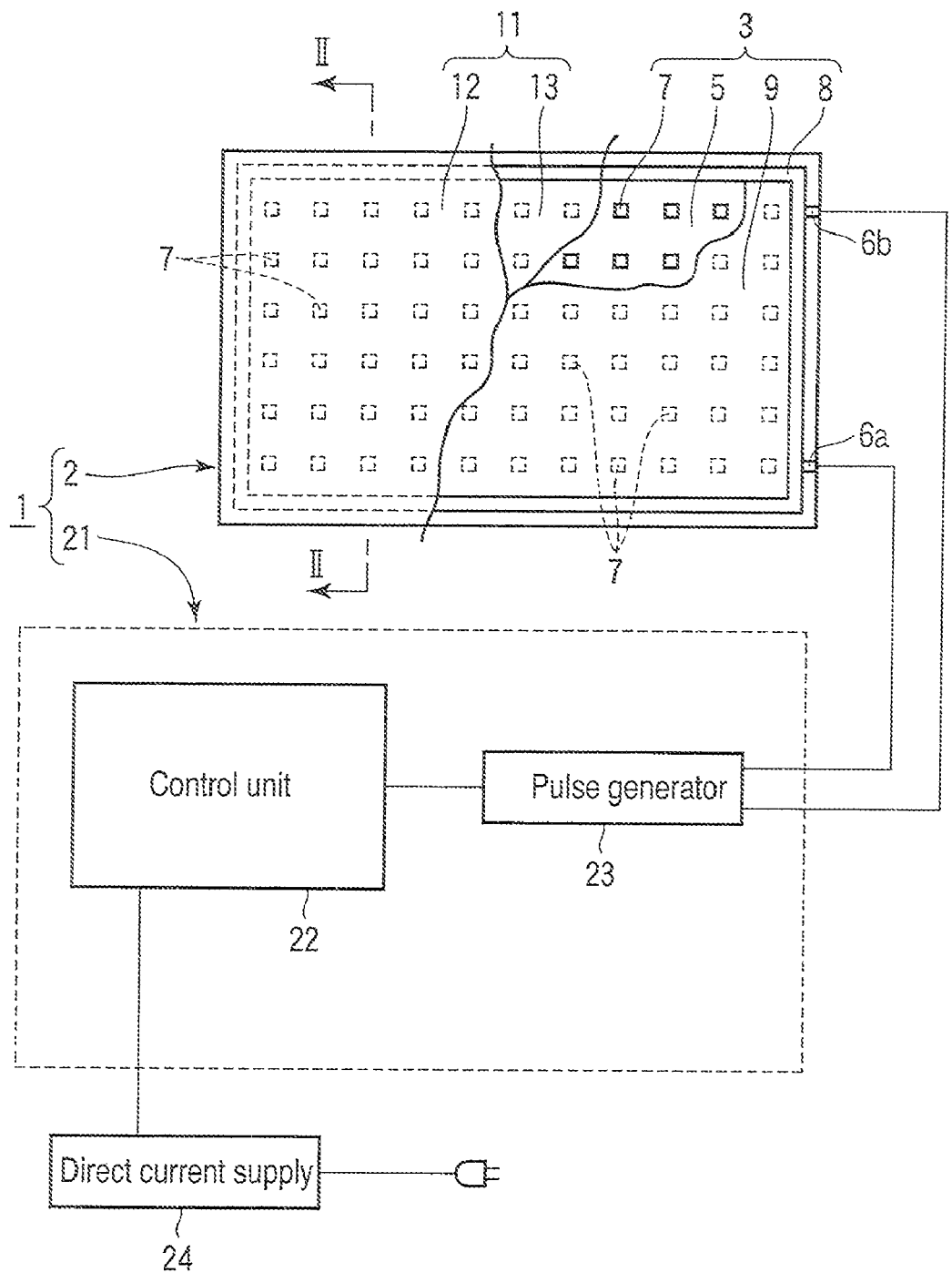
FIG. 1 is a schematic view illustrating a lighting device according to a first embodiment of the invention.
Figure 2:
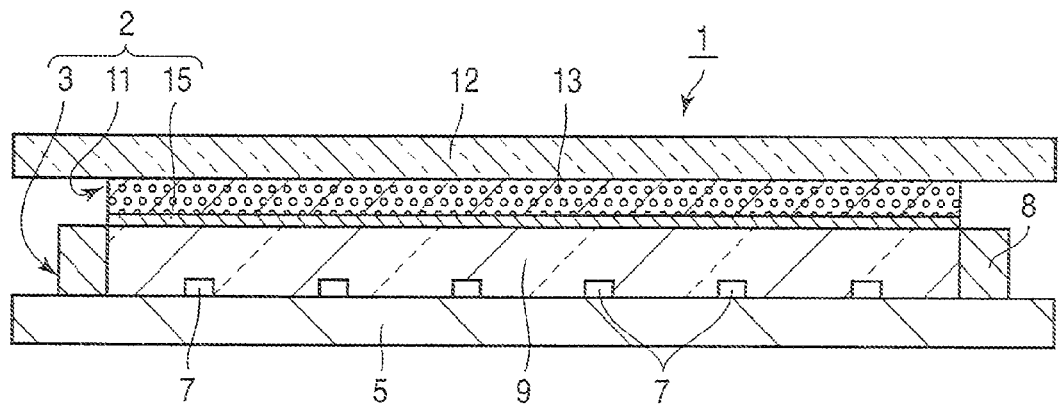
FIG. 2 is a sectional view taken along line II-II of FIG. 1.

Referring first to FIGS. 1 and 2, a lighting device 1 according to a first embodiment of the invention will be described. The lighting device 1 is a generally used lighting device.

As shown in FIG. 1, the lighting device 1 comprises, for example, a chip-on-board (COB) type light-emitting module 2, and a switching unit 21. The light-emitting module 2 of the first embodiment is formed in a relatively small rectangular block having a size of approx. 30 mm×30 mm.

The light-emitting module 2 comprises a light-emitting assembly 3 and a color conversion unit 11. As shown in FIG. 2, the light-emitting assembly 3 and color conversion unit 11 are adhered to each other by an adhesive layer 15.

The light-emitting assembly 3 comprises a rectangular printed wiring board 5 (board), a plurality of light-emitting elements 7, a rectangular frame member 8 and a sealing member 9. The color conversion unit 11 comprises a rectangular cover member 12, and a fluorescent substance layer 13. The color conversion unit 11 also includes a structure in which the cover member 12 is formed integral with the fluorescent substance layer 13 as one body. In the description below, in, for example, FIG. 2, the lower side of the printed wiring board 5 will be referred to as the "inner side," and the upper side of the cover member 12 will be referred to as the "outer side."

A circuit pattern (not shown) formed using, for example, copper foil is provided on the printed wiring board 5 of the light-emitting assembly 3. Electrodes 6a and 6b shown in FIG. 1 are provided at the opposite ends of the circuit pattern. The two electrodes 6a and 6b extend to the periphery of the printed wiring board 5.

The light-emitting elements 7 are, for example, semiconductor light-emitting elements. In this embodiment, LED chips that have a dominant wavelength of 460 nm and can emit blue light are used as the light-emitting elements 7. Assume that the blue light indicates light of relatively short wavelengths included in visible light, and that includes ultraviolet light. Although in the embodiment, the light-emitting elements 7 are designed to emit blue light, the invention is not limited to this. The light-emitting elements 7 may emit light of any color.

As shown in FIG. 1, the light-emitting elements 7 are arranged in rows and columns on the entire surface of the printed wiring board 5. In the embodiment, the light-emitting elements 7 are connected in series to the above-mentioned circuit pattern by, for example, bonding wires (not shown). The light-emitting elements 7 may be mounted on the printed wiring board 5 by flip chips or die bonding.

The frame member 8 is a rectangular frame that is one-size smaller than the printed wiring board 5, and is closely attached to the peripheral surface of the printed wiring board 5 to surround all light-emitting elements 7. The electrodes 6a and 6b of the circuit pattern are led to the outside of the frame member 8. It is preferable that the frame member 8 be formed of, for example, white synthetic resin in order to enable light to reflect on the inner side surfaces of the frame member 8.

The sealing member 9 is filled inside the frame member 8 to seal the light-emitting elements 7 surrounded by the frame member 8. The surface of the sealing member 9 is level with those surfaces of the frame member 8 that are away from the printed wiring board 5. The sealing member 9 has a function of preventing ingress of moisture and/or corrosive gasses.

Moreover, the sealing member 9 needs to transmit therethrough the blue light emitted from the light-emitting elements 7, and is therefore formed of a light-transmitting material. In the first embodiment, the sealing member 9 is formed of transparent silicone resin. Alternatively, the sealing member 9 may be formed of other light-transmitting materials, such as transparent rubber, transparent glass and translucent ceramic. In any case, the sealing member 9 has only a function of sealing the light-emitting elements 7 and the wiring pattern, and hence does not contain a fluorescent substance, which will be described later.

As shown in FIGS. 1 and 2, the cover member 12 of the color conversion unit 11, which is placed on the outer side of the light-emitting assembly 3, is formed of a rectangular plate having substantially the same size as the printed wiring board 5. Since the cover member 12 also needs to efficiently transmit therethrough the light emitted from the light-emitting assembly 3, it is formed of a light-transmitting material. In the first embodiment, the cover member 12 is formed of transparent reinforced glass. At least the inner surface of the cover member 12 is formed flat.

The cover member 12 may be formed of a relatively hard resin, such as acryl or polycarbonate. Since, in particular, the cover member 12 serves as an outermost member that covers the light-emitting portion of the lighting device 1, it is desirable that the cover member be formed of a material that does not easily scar or crack and has a high weatherproof, as well as a high light transmitting property.

In light of the above, the first embodiment employs a reinforced glass as the material of the cover member 12. However, if the cover member 12 is not used as the outermost member of the lighting device 1, it is desirable to form the cover member of a transparent material having substantially the same refractive index as the sealing member 9 of the light-emitting assembly 3, and the transparent matrix, described later, of the fluorescent substance layer 13.

The fluorescent substance layer 13 is printed on the inner surface of the cover member 12, and has a sufficient size to cover at least the surface of the sealing member 9 when the color conversion unit 11 is placed on the outer surface of the light-emitting assembly 3. The transparent matrix of the fluorescent substance layer 13, which is formed of, for example, transparent silicone resin, contains uniformly dispersed yellow fluorescent particles.

The above-mentioned yellow fluorescent substance is excited when it absorbs the above-described blue light emitted from the light-emitting elements 7, thereby mainly emitting yellow light. Further, the above-mentioned yellow light includes green light, and indicates light of an intermediate color that has a wavelength longer than the blue light and shorter than red light described later. For instance, the yellow fluorescent substance that emits light of such an intermediate color is, for example, oxide phosphor such as $Ca_3Sc_2O_4$:Ce, or a silicate- or sialon-based phosphor such as $(Ba, Sr)_2SiO_4$: Eu or $(Ba, Sr, Mg, Ca)_2SiO_4$:Eu, or YAG. $(Ca, Sr, Ba)_2SiN_2$: Eu, or thiogallate.

To suppress reflection loss of transmitted light, which will be described later, it is desirable that the transparent matrix of the fluorescent substance layer 13 be formed of a material having a refractive index near that of the sealing member 9 (and cover member 12). Further, it is important to uniformly disperse the yellow fluorescent substance in the transparent matrix so that when the intensity distribution of yellow light emitted from the yellow fluorescent substance is observed from the outer surface of the cover member 12, it will be uniform in the entire outer surface.

The adhesive layer 15 is formed of a material containing a light-transmitting resin material as a main component. For instance, this resin material is silicone resin or epoxy resin. The adhesive layer 15 couples the sealing member 9 of the light-emitting assembly 3 to the fluorescent substance layer 13 of the color conversion unit 11 in an airtight manner.

In other words, the color conversion unit 11 is laminated via the adhesive layer 15 on the outer side of the light-emitting assembly 3, from which blue light is emitted. Accordingly, the blue light emitted by each light-emitting element 7 passes through the transparent adhesive layer 15, enters the fluorescent substance layer 13, and passes through the cover member 12. Thus, the blue light is emitted.

Since, as described above, the light-emitting assembly 3 is adhered to the color conversion unit 11 using the adhesive layer 15, no air layer exists between the sealing member 9 and the fluorescent substance layer 13. As a result, the thermal conductivity between the sealing member 9 and the adhesive layer 15, and that between the adhesive layer 15 and the fluorescent substance layer 13 are enhanced.

Namely, elimination of air layers enables the heat produced when the light-emitting elements 7 are lit to be efficiently transmitted to the cover member 12 via the sealing member 9, the adhesive layer 15 and the fluorescent substance layer 13. Furthermore, since the fluorescent substance layer 13 is printed on the inner surface of the cover member 12, the fluorescent substance layer 13 and the cover member 12 are coupled to each other with a reliable degree of contact, whereby the heat produced by the light-emitting elements 7, and the heat slightly produced when the yellow fluorescent substance is excited to emit light, can be efficiently transmitted to the cover member 12. In other words, the first embodiment provides a heat dissipation structure for dissipating heat from the light emission side of the lighting device 1, i.e., from the outer side of the cover member 12.

In addition, since the sealing member 9 is adhered to the fluorescent substance layer 13 in an airtight manner by the adhesive layer 15, the reflection loss at the interface between the sealing member 9 and the adhesive layer 15, and that at the interface between the adhesive layer 15 and the fluorescent substance layer 13 are suppressed. As a result, the blue light emitted by the light-emitting elements 7 can be used without loss, and can be input efficiently to the fluorescent substance layer 13.

In particular, in the first embodiment, to suppress the reflection loss at the above-mentioned interfaces, the sealing member 9 and the transparent matrix of the fluorescent substance layer 13 are formed of materials having close refractive indexes, and the adhesive layer 15 is formed using, as a main component, a resin material that has a refractive index close to those of the sealing member 9 and the transparent matrix of the fluorescent substance layer 13. The resin material is, for example, transparent silicon resin or transparent epoxy resin.

As described above, by effectively using the blue light emitted by the light-emitting elements 7, the amount of the blue light passing through the fluorescent substance layer 13 and the cover member 12 can be increased, and the yellow fluorescent substance contained in the fluorescent substance layer 13 can absorb much more blue light and hence produce much more yellow light. In other words, the first embodiment not only can increase the amount of the blue light passing through the cover member 12, but also can increase the amount of the yellow light produced by the yellow fluorescent substance and passing through the cover member 12. As a result, the light emission efficiency of the lighting device 1 can be enhanced.

Further, in the first embodiment, the color conversion unit 11 is stacked on the sealing member 9 of the light-emitting assembly 3 to completely cover the same, and the cover member 12 is also used as the outermost member of the lighting device 1, as is described above. This being so, the lighting device 1 can be made thin and light, and the number of required components can be reduced, thereby reducing the manufacturing cost of the device.

Referring again to FIG. 1, the switching unit 21 connected to the light-emitting module 2 comprises a control unit 22 and a pulse generator 23. The output terminal of the pulse generator 23 is electrically connected to the electrodes 6a and 6b. The control unit 22 controls the generation timing, the width and the crest values of the pulses generated by the pulse generator 23. The control unit 22 is connected to a direct current supply 24. Although the first embodiment employs the switching unit 21 that incorporates the pulse generator 23, the switching scheme of the light-emitting module 2 is not limited to this.

The operation of the lighting device 1 of the first embodiment will now be described.

When the control unit 22 controls the pulse generator 23 to supply power to the light-emitting module 2, the plurality of light-emitting elements 7 are powered to thereby emit light containing blue light as main light. The light sequentially passes through the transparent sealing member 9 and adhesive layer 15 and enters the fluorescent substance layer 13 of the color conversion unit 11.

Part of the blue light input to the fluorescent substance layer 13 is absorbed by the yellow fluorescent substance dispersed in the fluorescent substance layer 13, while the remaining blue light passes through the transparent matrix of the fluorescent substance layer 13 and the cover member 12 of the color conversion unit 11, and is emitted as part of illumination light from the lighting device 1.

The yellow fluorescent substance that has absorbed blue light is excited by the same to emit light of a color different from blue, more specifically, yellow light mainly. Like the above-mentioned remaining blue light, the yellow light passes through the transparent matrix of the fluorescent substance layer 13 and the cover member 12, and is emitted as the other part of the illumination light from the lighting device 1.

Thus, the lighting device 1 of the first embodiment emits, as the illumination light, white light that is a mixture of the yellow light produced by the yellow fluorescent substance in the fluorescent substance layer 13, and the blue light passing through the transparent matrix of the fluorescent substance layer 13.

As described above, in the first embodiment, the yellow fluorescent substance as a light source for producing yellow light that is the compensatory light of blue light is mixed only in the fluorescent substance layer 13 of the color conversion unit 11, and is not mixed in the sealing member 9. Namely, in the first embodiment, a color conversion function and a sealing function are imparted to two different layers, i.e., the fluorescent substance layer 13 and the sealing member 9, respectively, with the result that both the color conversion function and the sealing function can be optimized.

In other words, in the embodiment, the sealing member 9 can be formed to an optimal thickness for sealing the light-emitting elements 7, without considering the color conversion characteristic (wavelength conversion characteristic) of the fluorescent substance layer 13. Similarly, without considering the sealing performance of the sealing member 9, the thickness of the fluorescent substance layer 13 can be set to an optimal value that enables the color conversion characteristic of the fluorescent substance layer 13 to be optimized. In other words, the two layers, i.e., the fluorescent substance layer 13 and the sealing member 9, enable both the sealing performance and the color conversion performance to be optimized.

Further, the two layers of the fluorescent substance layer 13 and the sealing member 9 prevent the entire light-emitting module 2 from being discarded even when a defect due to mixture of, for example, air bubbles or extraneous materials occurs during a manufacturing process, thereby enhancing the yield of products. Namely, even when a defect occurs in the fluorescent substance layer 13, only the color conversion unit 11 can be exchanged with an appropriate one, with the printed wiring board 5, the light-emitting elements 7 and the sealing member 9 of the light-emitting assembly 3 kept as they are.

Furthermore, since in the embodiment, the fluorescent substance layer 13 is covered with the cover member 12, ingress of moisture or corrosive gasses to the fluorescent substance layer 13 can be prevented, thereby protecting the fluorescent substance layer 13 from damage. Yet further, since the cover member 12 is formed of reinforced glass, the fluorescent substance layer 13 can be easily provided by screen printing on the inner surface of the cover member 12. Thus, the cover member 12 can be used as a carrier member for carrying the fluorescent substance layer 13.

As is evident from the above, the fluorescent substance layer 13 can be handled more easily during the assembly of the lighting device 1 than in the case of handing the fluorescent substance layer 13 as a single member. In particular, when the fluorescent substance layer 13 is patterned into a plurality of areas on the inner surface of the cover member 12 as in second and third embodiments, described later, it is effective to perform screen printing of the fluorescent substance layer 13 on the inner surface.

In the embodiment, when the light-emitting module 2 is manufactured, the light-emitting assembly having the light-emitting elements sealed therein, and the color conversion unit 11 that includes the cover member 12 having its inner surface printed with the fluorescent substance layer 13 are produced separately, and are adhered to each other by the adhesive layer 15. Accordingly, the thicknesses of the layers can be controlled easily to desired values. In particular, since the fluorescent substance layer 13 is formed by screen printing on the inner surface of the cover member 12, the thickness of the fluorescent substance layer 13 and the concentration of the yellow fluorescent substance can be controlled to desired values, and hence the light-emitting characteristic of the lighting device 1 can be easily controlled to a desired one.

In addition, since the lighting device 1 of the first embodiment has a structure in which a plurality of light-emitting elements 7 are arranged in rows and columns as shown in FIG. 1, it is desirable that the cover member 12 should have diffusion means. The diffusion means includes all means for diffusing the light that passes through the fluorescent substance layer 13 and enters the cover member 12 from the inner surface thereof. In particular, if the distance between each light-emitting element 7 as a light source and the surface of the cover member 12 that serves as a light emitting surface is short as in the lighting device 1 of the embodiment, the diffusion means is effective.

In contrast, if, for example, the cover member 12 is formed of transparent reinforced glass, the intensity of light passing through the cover member 12 differs between the areas aligned with the light-emitting elements 7, and the area that is not aligned with them. As a result, the light-emitting elements 7 are too much clearly seen in front of the cover member 12, which degrades the visual quality of the lighting device. Namely, the areas aligned with the light-emitting elements 7 have a higher luminance than the other area.

The aforementioned diffusion means can include executing a frost process on at least one of the outer and inner surfaces of the cover member 12, and forming the cover member 12 of a translucent material. In the lighting device 1 of the first embodiment, the outer surface of the cover member 12 is formed by the frost process into a light diffusion surface having a roughness of approx. 0.30 to 1.50 μm.

By subjecting at least one surface of the cover member 12 to a frost process, light passing through the areas on the cover member 12 that are aligned with the light-emitting elements 7 is diffused, whereby these areas are prevented from becoming conspicuously higher in luminance than the other area. As a result, uneven luminance distribution on the surface of the cover member 12 can be suppressed. The uneven luminance distribution can also be suppressed by forming the cover member 12 of a material having light diffusing/transmitting properties, as mentioned above.

Figure 3:
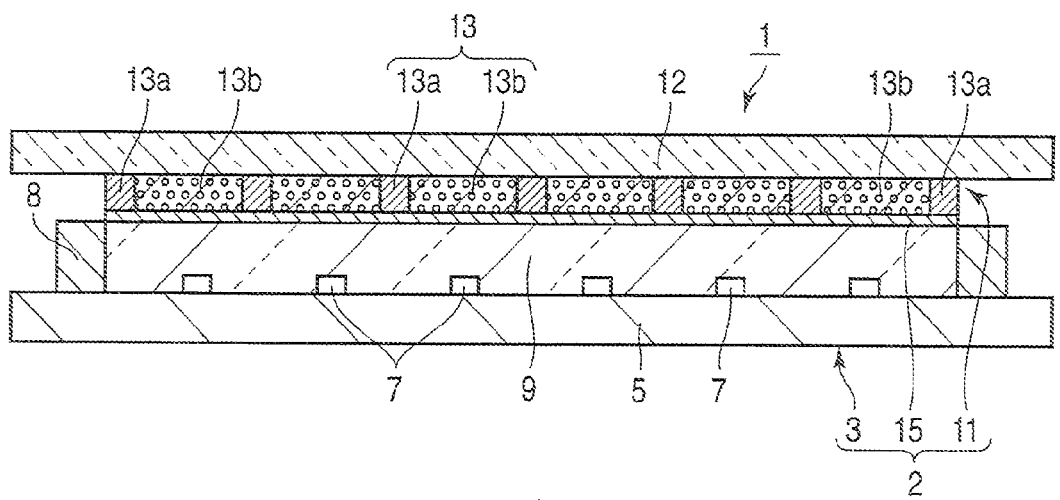
FIG. 3 is a sectional view illustrating a lighting device according to a second embodiment of the invention.

Referring then to FIGS. 3 and 4, a lighting device 1 according to a second embodiment of the invention will be described. The lighting device 1 of the second embodiment has substantially the same structure as that of the first embodiment except for the structure of the fluorescent substance layer 13. Therefore, in the second embodiment, elements similar to those of the first embodiment are denoted by corresponding reference numbers, and no detailed description will be given thereof.

The fluorescent substance layer 13 of the second embodiment comprises red fluorescent substance areas 13a, and non-red fluorescent substance areas 13b. Also in the second embodiment, the fluorescent substance layer 13 is provided on the inner surface of the cover member 12 by screen printing. Thus, even when the fluorescent substance layer 13 is divided into a plurality of areas on the entire inner surface of the cover member 12, there is no need of providing, for example, partitions between the areas.

The red fluorescent substance areas 13a each contain red fluorescent particles that are uniformly dispersed and are excited by the above-described blue light to produce red light having a main wavelength of approx. 620 nm to 650 nm. The red light indicates light having a wavelength longer than that of the yellow light. The red fluorescent substance is, for example, $Sr_2Si_5N_8$:Eu, $CaAlSiN_3$:Eu, $LaO_2$, etc.

The red fluorescent substance areas 13a may contain another type of fluorescent particles, such as green fluorescent particles that are excited by the blue light emitted by the light-emitting elements 7 to produce green light having a main wavelength of approx. 520 nm. However, if different types of fluorescent substances that produce light having different wavelengths are mixed in each area, part of the light is absorbed by the different types of fluorescent particles, thereby reducing the efficiency of light emission. Therefore, it is desirable to contain the green fluorescent particles in areas other than the red fluorescent substance areas.

In the non-red fluorescent substance areas 13b, a non-red fluorescent substance that absorbs the above-described blue light and emits light other than red light is uniformly dispersed. A yellow fluorescent substance that emits yellow light having a main wavelength of approx. 540 nm to 565 nm when it is excited can be used as the non-red fluorescent substance. This yellow fluorescent substance is similar to that used in the first embodiment. In the second embodiment, the yellow fluorescent substance is used as the non-red fluorescent substance.

The red fluorescent substance areas 13a and the non-red fluorescent substance areas (yellow fluorescent substance areas) 13b may be printed rectangular such that they are alternately arranged as shown in FIG. 4A. Alternatively, the red fluorescent substance areas 13a may be printed in a lattice such that they surround the non-red fluorescent substance areas 13b, as is shown in FIG. 4B. In any case, the red fluorescent substance areas 13a and the non-red fluorescent substance areas 13b are in contact with each other on the entire inner surface of the cover member 12.

Further, as shown in FIG. 3, in the second embodiment, the fluorescent substance layer 13 is patterned such that the non-red fluorescent substance areas (yellow fluorescent substance areas) 13b are aligned with the light-emitting elements 7, and the red fluorescent substance areas 13a are each arranged between the corresponding pair of adjacent light-emitting elements 7. In other words, in the second embodiment, the fluorescent substance areas are patterned so that the light-emitting elements 7 are aligned with the non-red fluorescent substance areas 13b.

In the above-described structure, when the lighting device 1 of the second embodiment is turned on, the blue light emitted by the light-emitting elements 7 enters the fluorescent substance layer 13 to thereby excite the red fluorescent substance contained in the red fluorescent substance areas 13a, and the yellow fluorescent substance contained in the non-red fluorescent substance areas 13b. As a result of this excitation, the red fluorescent substance emits red light for improving the color rendering properties, and the yellow fluorescent substance emits light of yellow as the compensatory color of blue. Thus, the lighting device 1 emits, as illumination light, white light of improved color rendering properties, which is a mixture of red and yellow light emitted by the red and yellow fluorescent substances contained in the fluorescent substance layer 13, and the blue light having passed through the fluorescent substance layer 13.

It is important to design the concentration of the fluorescent substance contained in each fluorescent substance area 13a or 13b and the size of each fluorescent substance area 13a or 13b, so that the illumination light emitted by the lighting device 1 through the fluorescent substance layer 13 patterned as the above has a uniform color and intensity over the plane perpendicular to the optical axis of the device.

Namely, it is desirable to set, to substantially the same concentration, the fluorescent substances in the areas 13a and 13b so that the blue light, which is not absorbed by the fluorescent substances and passes through the transparent matrix of the fluorescent substance layer 13, will have a uniform intensity on the entire outer surface of the fluorescent substance layer 13. In this state, it is desirable to set, to an appropriate value, the ratio of the size of the red fluorescent substance area 13a to the non-red fluorescent substance area 13b, so that the lighting device 1 can emit red light produced by the red fluorescent substance so that the red light can realize desired color rendering properties.

Further, it is important to make the fluorescent substance areas 13a and 13b of the fluorescent substance layer 13 have the same thickness, so as not to form a clearance between the fluorescent substance layer 13 and the adhesive layer 15 when the fluorescent substance layer 13 of the color conversion unit 11 is adhered to the surface of the sealing member 9 of the light-emitting assembly 3 via the adhesive layer 15. In the second embodiment, the fluorescent substance areas 13a and 13b of the fluorescent substance layer 13 are patterned by screen printing to a uniform thickness.

It is known that red fluorescent substances absorb not only blue light but also green and yellow light to thereby emit red light. Accordingly, if a red fluorescent substance for improving the color rendering properties is contained in a yellow fluorescent substance area, part of the yellow light (including green light) produced by the yellow fluorescent substance is absorbed by the fluorescent substance. As a result, the light output is reduced. Thus, the light-emitting efficiency of the lighting device 1 is degraded.

In light of the above, in the second embodiment, the fluorescent substance layer 13 is divided into the red fluorescent substance areas 13a and the non-red fluorescent substance areas 13b. This extremely reduces the degree with which the red fluorescent substance absorbs, as excitation energy, part of the yellow light produced by the yellow fluorescent substance, whereby the light-emitting efficiency of the lighting device 1 can be enhanced.

Furthermore, since the yellow light produced by the yellow fluorescent substance is brighter than the red light produced by the red fluorescent substance, reduction of the light output can be suppressed by aligning the non-red fluorescent substance areas (yellow fluorescent substance areas) 13b with the light-emitting elements 7 as in the second embodiment. Thus, the fluorescent substance layer 13 is patterned to align the non-red fluorescent substance areas 13b with the light-emitting elements 7, thereby enhancing the brightness of the lighting device 1.

Also in the second embodiment, a frost process can be performed on the cover member 12. The frost process may be performed on the entire surface of the cover member 12, or may be performed to make it difficult to detect the pattern of the fluorescent substance layer 13 from the outer side of the lighting device 1.

When the frost process is performed on the entire surface of the cover member 12 by, for example, forming the cover member 12 of a translucent material, no further process must be performed on the cover member 12 to thereby reduce the manufacturing cost of the lighting device 1. Further, in this case, the light entering the cover member 12 can be diffused in the entire cover member 12, whereby the light of different colors providing the illumination light can be effectively mixed to suppress color shading.

Also, a frost process is performed only on the portions of the cover member 12 that are aligned with the red fluorescent substance areas 13a, to thereby diffuse only the red light and mix the same with the yellow light. In this case, only the red light produced by the red fluorescent substance areas 13a is effectively diffused to prevent the pattern of the red fluorescent substance areas 13a from becoming extremely conspicuous. Further, in this case, the light close to white light, produced by the non-red fluorescent substance areas 13b, can be easily mixed with the red light produced by the red fluorescent substance areas 13b adjacent to the areas 13a, and be diffused and emitted via the frost-processed portions of the cover member 12. As a result, color shading of the illumination light can be suppressed.

The following table 1 shows the measured quantities of light emitted from the lighting devices of the first and second embodiments and comparative examples 1 and 2.

TABLE 1

| | Fluorescent substance layer | Sealing member (silicone resin) | Light quantity |
|---|---|---|---|
| First embodiment | YAG: 100 μm | 800 μm | 115 |
| Second embodiment | YAG: 100 μm CASN 100 μm | 800 μm | 110 |
| Comparative example 1 | YAG: 800 μm | | 100 |
| Comparative example 2 | YAG + CASN: 800 μm | | 95 |

The lighting device 1 of the first embodiment employed a fluorescent substance layer 13 that had a film thickness of 100 μm and had YAG fluorescent substance (as the yellow fluorescent substance) uniformly dispersed in the transparent matrix of the layer, and also employed a sealing member 9 that had a film thickness of 800 μm and was formed of silicone resin.

The lighting device 1 of the second embodiment employed a fluorescent substance layer 13 that had non-red fluorescent substance areas 13b in which YAG fluorescent substance as the yellow fluorescent substance was uniformly dispersed, and red fluorescent substance areas 13a in which CASN (CaAlSiN$_3$:Eu) as the red fluorescent substance was uniformly dispersed, the areas 13a and 13b being formed in a stripe pattern similar to that shown in FIG. 4A. The stripe pattern of the fluorescent substance layer 13 had a line width of 50 μm and a film thickness of 100 μm. Further, the sealing member 9 of the second embodiment had a film thickness of 800 μm and was formed of silicone resin.

In contrast, in the lighting device of comparative example 1, YAG fluorescent substance (yellow fluorescent substance) was dispersed in a sealing member having a film thickness of 800 μm and formed of silicone resin. In the lighting device of comparative example 2, YAG fluorescent substance and CASN (red fluorescent substance) was dispersed in a sealing member having a film thickness of 800 μm and formed of silicone resin. In the first and second embodiments, and comparative examples 1 and 2, blue LEDs were used as the light-emitting elements 7.

As is evident from Table 1, assuming that the quantity of the light measured in comparative example 1 is 100, the quantity of the light measured in comparative example 2, in which the color rendering properties were improved compared to comparative example 1, is 95. It is considered that the reduction of the light-emitting efficiency results from the fact that in comparative example 2, CASN producing a less quantity of light than YAG fluorescent substance was mixed, and that part of the yellow light produced by the YAG fluorescent substance was absorbed by the CASN.

Further, the light quantity of the first embodiment with respect to that of comparative example 1 is 115. It is considered that the increase in the light-emitting efficiency of the first embodiment results from the fact that the first embodiment employed, as a member separate from the sealing member 9, the fluorescent substance layer 13 stacked on the sealing member 9 and having the YAG fluorescent substance dispersed therein. Namely, it is considered that since the sealing member 9 and the fluorescent substance layer 13 were formed as separate members, the fluorescent substance layer 13 could be designed to obtain a desired light-emitting characteristic, without considering the sealing function, and hence a larger quantity of illumination light could be obtained.

Furthermore, the light quantity of the second embodiment, in which higher color rendering properties than in the first embodiment were realized, is 110 with respect to that of comparative example 1. It is considered that the decrease in the light-emitting efficiency of the second embodiment compared to that of the first embodiment results from the fact that the second embodiment employed the red fluorescent substance areas 13a in which the red fluorescent substance that produces a less quantity of light than the yellow fluorescent substance was dispersed.

However, it is confirmed that the lighting devices of the first and second embodiments can generate a greater quantity of light at least than the devices of comparative examples 1 and 2.

Figure 5:
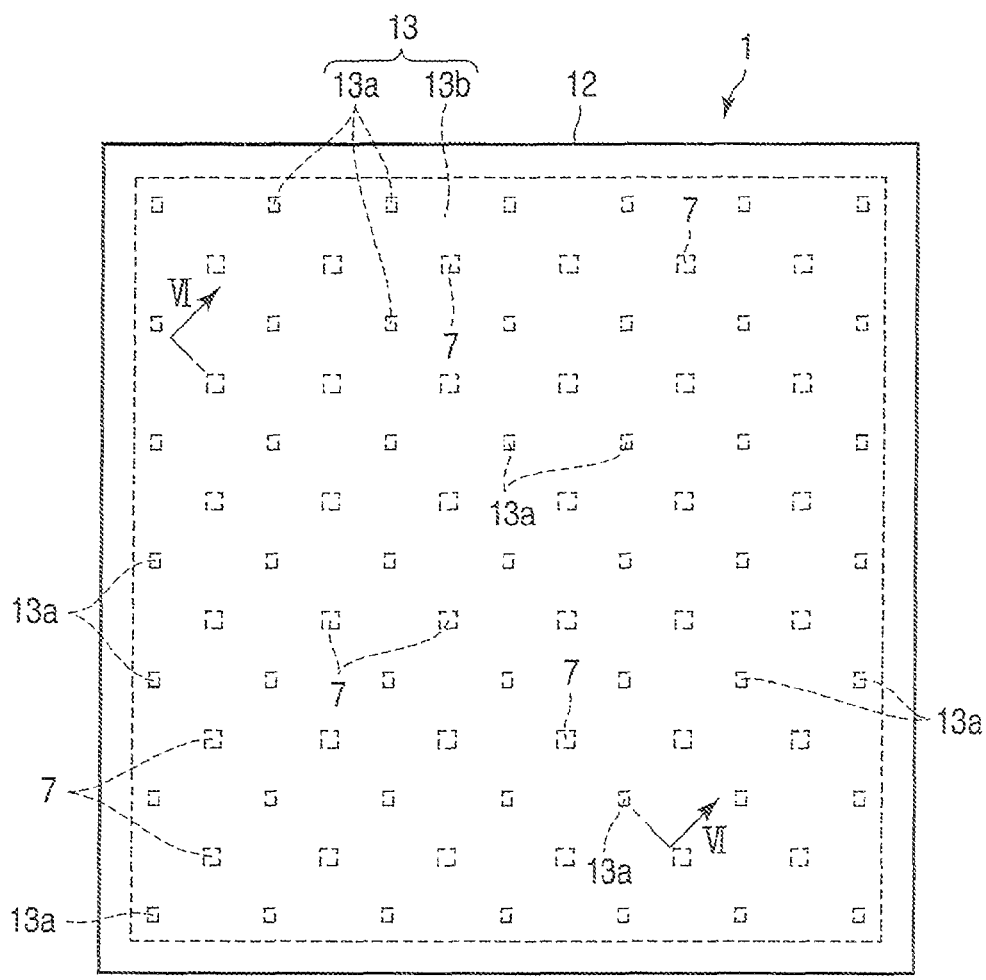
FIG. 5 is a plan view illustrating the outer side of a lighting device according to a third embodiment of the invention.
Figure 6:
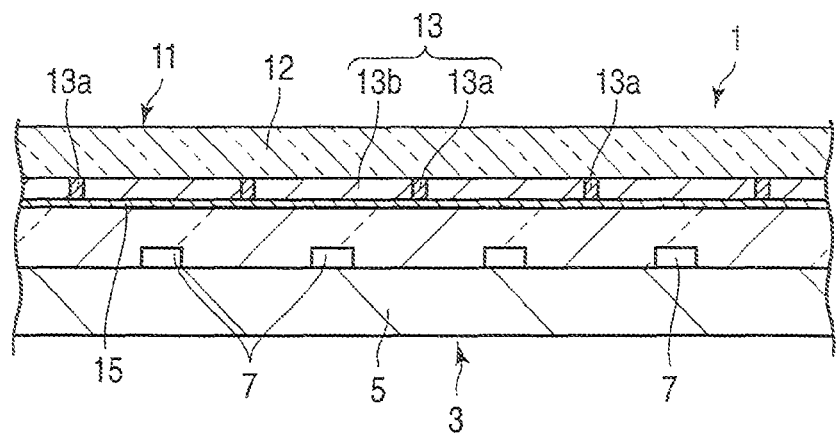
FIG. 6 is a sectional view taken along line VI-VI of FIG. 5.
Figure 7:
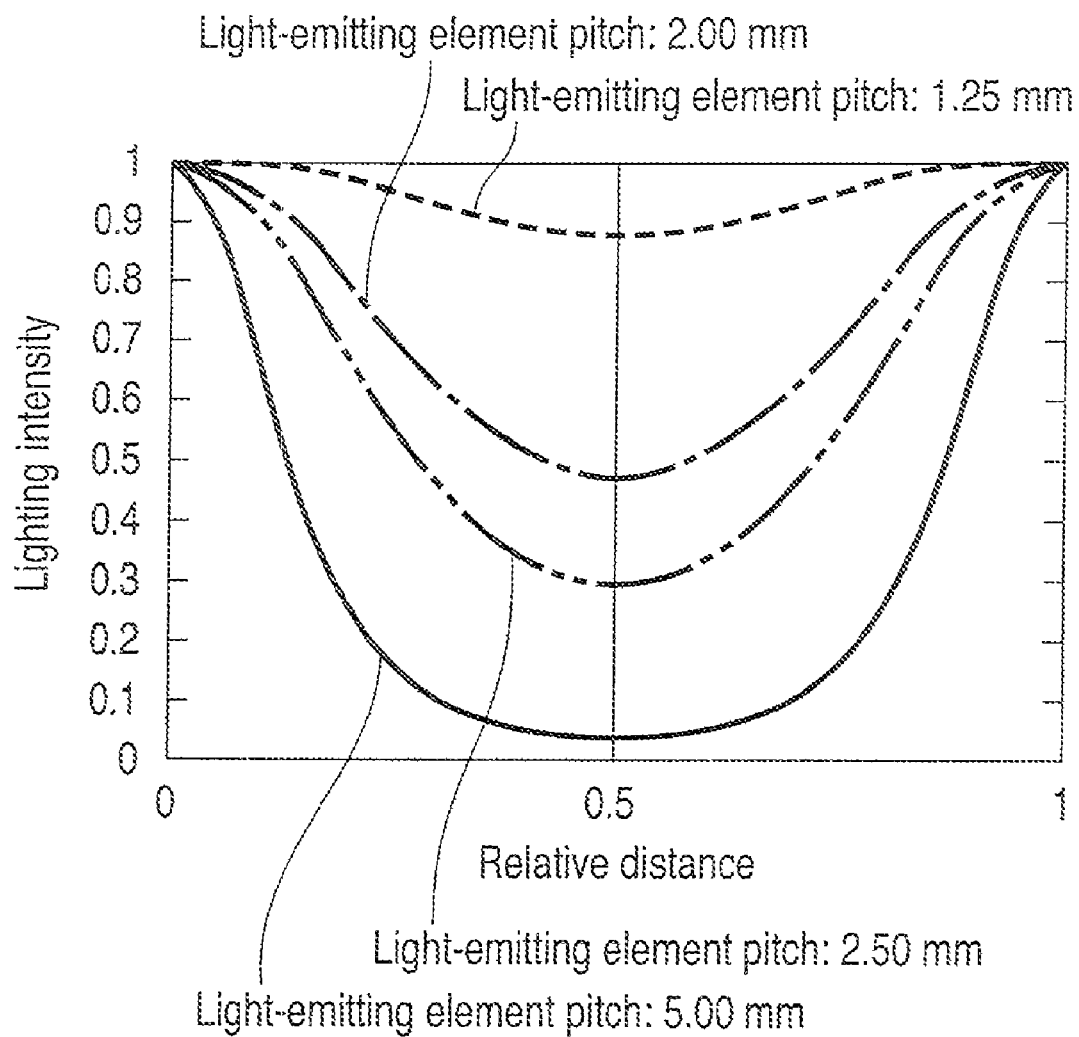
FIG. 7 is a graph illustrating the relationship between the lighting intensity measured between adjacent two light-emitting elements shown in FIG. 6, and the pitch of the two light-emitting elements.

Referring now to FIGS. 5 to 7, a third embodiment of the invention will be described.

The lighting device 1 of the third embodiment has substantially the same structure as the first embodiment except for the structure of the fluorescent substance layer 13. Therefore, in the third embodiment, elements similar to those of the first embodiment are denoted by corresponding reference numbers, and no detailed description will be given thereof.

In the third embodiment, the fluorescent substance layer 13 formed by screen printing on the inner surface of the cover member 12 comprises a non-red fluorescent substance area (yellow fluorescent substance area) 13b extending in the entire surface of the fluorescent substance layer 13, and red fluorescent substance areas 13a arranged in rows and columns with substantially regular intervals in the non-red fluorescent substance area 13b, as is shown in FIG. 5. The non-red fluorescent substance area 13b corresponds to the fluorescent substance layer 13 of the first embodiment.

The red fluorescent substance areas 13a arranged in dots in the non-red fluorescent substance area 13b contain red fluorescent particles that are excited by flue light emitted by the light-emitting elements 7 to thereby emit red light having a main wavelength of, for example, 620 nm to 650 nm. The red fluorescent substance areas 13a are arranged in dots of substantially the same shape. The shape of the dots is not limited a rectangle as shown in FIG. 5, but may be modified to, for example, a circle or other shapes. In the third embodiment, since the light-emitting elements 7 have rectangular light-emitting areas, the red fluorescent substance areas 13a are formed rectangular.

The red fluorescent substance areas 13a may also contain a fluorescent substance that produces light other than red light. For instance, the red fluorescent substance areas 13a may contain, as the fluorescent substance other than the red fluorescent substance, a green fluorescent substance that is excited by the blue light emitted by the light-emitting elements 7 to emit green light having a main wavelength of approx. 520 nm. However, if different types of fluorescent substances that produce light having different wavelengths are mixed in each area 13a, part of the light emitted by a fluorescent substance of high excitation energy is absorbed by the different types of fluorescent substances. Therefore, it is desirable to contain the green fluorescent particles in areas other than the red fluorescent substance areas.

In the non-red fluorescent substance area 13b, another color fluorescent substance that is excited by the blue light emitted by the light-emitting elements 7 to emit light of another color is dispersed in the transparent matrix. In the third embodiment, a yellow fluorescent substance that produces yellow light having a main wavelength of approx. 540 nm or 565 nm when it is excited. The yellow fluorescent substance is the same as that used in the first and second embodiments.

Further, as shown in FIGS. 5 and 6, each of the light-emitting elements 7 is arranged at the same distance to the corresponding one of the red fluorescent substance areas 13a arranged in rows and columns, when viewed from the outer side of the cover member 12. In other words, the non-red fluorescent substance area (yellow fluorescent substance area) 13b is aligned with the light-emitting elements 7. The other structural elements of the third embodiment, which includes elements other than those shown in FIGS. 5 and 6, are the same as that of the first embodiment.

When the lighting device 1 of the third embodiment is turned on, the blue light emitted by the light-emitting elements 7 excites the red fluorescent substance contained in the red fluorescent substance areas 13a, and the yellow fluorescent substance contained in the non-red fluorescent substance area 13b. As a result of this excitation, the red fluorescent substance emits red light for improving the color rendering properties, and the yellow fluorescent substance emits yellow light. The red and yellow light produced by the red and yellow fluorescent substances contained in the fluorescent substance layer 13, and the blue light that is not absorbed by the fluorescent substances of the fluorescent substance layer 13 and passes therethrough, are mixed with each other to thereby form white light improved in color rendering properties. This white light is emitted as the illumination light by the lighting device 1.

As described above, also in the third embodiment, the fluorescent substance layer 13 is divided into the red fluorescent substance areas 13a and the non-red fluorescent substance areas 13b. This extremely reduces the degree with which the red fluorescent substance absorbs, as excitation energy, part of the yellow light produced by the yellow fluorescent substance, whereby the light-emitting efficiency of the lighting device 1 can be enhanced.

Furthermore, since the yellow light produced by the yellow fluorescent substance is brighter than the red light produced by the red fluorescent substance, reduction of the light output can be suppressed by aligning the non-red fluorescent substance area (yellow fluorescent substance area) 13b with the light-emitting elements 7 as in the third embodiment. Thus, the fluorescent substance layer 13 is patterned to align the non-red fluorescent substance area 13b with the light-emitting elements 7, thereby enhancing the brightness of the lighting device 1.

In general, red light contained in the illumination light emitted by a lighting device 1 of the above type is mixed therein for the purpose of enhancing the average color rendering property estimation value (Ra) used to estimate the color rendering properties. However, there is a limitation on the minimum size of the red fluorescent substance dot areas 13a that can be printed on a glass substrate. Therefore, to mix red light at a relatively low mixing ratio in order to improve the color rendering properties of the illumination light, the method of dispersing red fluorescent substance dots 13a in the entire transparent matrix as in the lighting device 1 of the third embodiment is effective.

For instance, assuming that the lighting device 1 of the third embodiment emits white light with a color temperature of 5000K and an average color rendering property estimation value (Ra) of 70, the ratio in size between the yellow fluorescent substance area 13b and each red fluorescent substance area 13a is approx. 97:3. If red fluorescent substance stripe areas 13a as shown in FIG. 4A are attempted to be formed in a yellow fluorescent substance area 13b of 30 mm×30 mm, only one red fluorescent substance stripe area 13a with a width of 0.9 mm can be formed in the yellow fluorescent substance area 13b.

Accordingly, if it is assumed that the minimum size of a dot that can be printed by the above-described screen printing is 1 mm, no red fluorescent substance stripe area 13a can be formed. Further, even if only one thin red fluorescent substance stripe area 13a that satisfies the above condition can be printed, the structure having only one extremely thin red fluorescent substance area 13a causes a problem in the mixture of light, and conspicuous color shading on the light-emitting surface.

Accordingly, to set the ratio of each red fluorescent substance area 13a to the yellow fluorescent, substance area 13b to a relatively high value, it is effective to form each red fluorescent substance area 13a as a dot, as in the lighting device 1 of the third embodiment. More specifically, if red fluorescent substance dots 13a are printed to satisfy the above-mentioned condition, rectangular dots of 1.04 mm×1.04 mm can be arranged in five rows and five columns in the yellow fluorescent substance area 13b of 30 mm×30 mm.

Another method of achieving similar color rendering properties is possible. In this method, the concentration of a red fluorescent substance dispersed in each red fluorescent substance area 13a is reduced and instead, the size of each red fluorescent substance area 13a. In this case, however, the intensity of the blue light applied to each red fluorescent substance area 13a is increased by the reduction degree of the concentration of the red fluorescent substance. Namely, in this case, the intensity of the blue light applied to each red fluorescent substance area 13a is higher than that of the blue light applied to the yellow fluorescent substance area 13b, whereby color shading will occur.

FIG. 7 is a graph illustrating illumination distributions obtained when the pitch between each pair of obliquely adjacent light-emitting elements 7 incorporated in the lighting device 1 of the above-described third embodiment is set to 5.00 mm, 2.50 mm, 2.00 mm and 1.25 mm. Namely, the above-mentioned pitch is defined along the line VI-VI of FIG. 5, and does not indicate the pitch between each pair of adjacent light-emitting elements 7 arranged in a row or column. The horizontal axis of the FIG. 7 graph indicates a relative distance assumed when each pitch is regarded as 1. Further, the center point of the horizontal axis indicates the light intensity at the intermediate position between each pair of adjacent light-emitting elements 7, namely, at the position corresponding to the center of each red fluorescent substance area 13a. The light intensity was measured at the position that is away by 1 mm from the outer surface of the cover member 12 and between each pair of adjacent light-emitting elements 7.

Accordingly, when the pitch of each pair of adjacent light-emitting elements 7 is set to 5.00 mm, the light intensity of the blue light at substantially the middle position between the two light-emitting elements 7 is almost zero, which means that almost no blue light applied to the center of each red fluorescent substance area 13a. In contrast, when the pitch of each pair of adjacent light-emitting elements 7 is set to 1.25 mm, which means that the light-emitting elements 7 are very close to each other, and hence blue light of substantially the same intensity as that of the blue light measured just above each light-emitting element 7 is applied to the red fluorescent substance area 13a between the adjacent light-emitting elements 7. Thus, the narrower the pitch between each pair of adjacent light-emitting elements 7, the higher the intensity of the blue light applied to the red fluorescent substance area 13a between the adjacent light-emitting elements 7.

Therefore, to adjust, to a constant value, the light intensity of red light at a position aligned with each red fluorescent substance area 13a, at which the light intensity is lowest on the surface of the lighting device 1, it is sufficient if the size of each red fluorescent substance area 13a is modified in accordance with the pitch of the light-emitting elements 7. For instance, when the pitch of each pair of adjacent light-emitting elements 7 is 5 mm, the light intensity at a position of an equal distance from the pair of light-emitting elements 7 is approx. 5% of the light intensity just above each light-emitting element 7. Therefore, it is necessary to increase the size of each red fluorescent substance area 13a. In contrast, when the pitch of each pair of adjacent light-emitting elements 7 is 2 mm, the light intensity at an equal distance from each pair of light-emitting elements 7 is approx. 50% of the light intensity just above each light-emitting element 7. Therefore, it is not necessary to increase the size of each red fluorescent substance area 13a.

In addition, if the size of the red fluorescent substance areas 13a dispersed in dots in the non-red fluorescent substance area 13b is increased, the space between each pair of adjacent red fluorescent substance areas 13a is narrowed, whereby the red fluorescent substance areas 13a are prevented from being extremely conspicuous. As a result, color shading on the light-emitting surface can be made difficult to detect. This is another advantage of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For instance, although in the second and third embodiments, the concentration of the red fluorescent substance contained in each red fluorescent substance area is set to substantially the same value as that of the yellow fluorescent substance contained in the yellow fluorescent substance area, the invention is not limited to this. The concentration of a fluorescent substance in an area may be set different from that in any other area in order to enhance the color rendering properties of the lighting device 1.

What is claimed is:

1. A lighting device comprising:

a plurality of light-emitting elements configured to emit blue light;

a board with the light-emitting elements mounted thereon;

a sealing member having light transmitting properties and sealing the light-emitting elements on the board; and a color conversion unit including a cover member formed of light transmitting materials, and a fluorescent substance layer provided on an inner surface of the cover member and having a transparent matrix containing a fluorescent substance dispersed therein, the fluorescent substance producing light of a color other than blue when being exited by the blue light, the fluorescent substance layer being interposed between the inner surface of the cover member and the sealing member; wherein the fluorescent substance layer is divided into at least one red fluorescent substance area in which a red fluorescent substance emitting red light when being excited by the blue light is dispersed in the transparent matrix, and at least one yellow fluorescent substance area in which a yellow fluorescent substance emitting yellow light when being excited by the blue light is dispersed in the transparent matrix, the at least one yellow fluorescent substance area being larger than the at least one red fluorescent substance area.

2. The lighting device according to claim 1, wherein the fluorescent substance layer is printed on the inner surface of the cover member and attached to the sealing member in an airtight manner.

3. The lighting device according to claim 2, further comprising an adhesive layer interposed between the sealing member and the fluorescent substance layer in an airtight manner, the adhesive layer having light-transmitting properties.

4. The lighting device according to claim 3, wherein the sealing member, the transparent matrix and the adhesive layer are formed of light-transmitting materials having substantially a same refractive index.

5. The lighting device according to claim 1, wherein the cover member includes diffusion means configured to diffuse light passing through the fluorescent substance layer and entering the cover member from the inner surface thereof, and to emit the diffused light through an outer surface of the cover member.

6. The lighting device according to claim 1, wherein a concentration of the red fluorescent substance contained in the at least one red fluorescent substance area, and a concentration of the yellow fluorescent substance contained in the at least one yellow fluorescent substance area are set such that a quantity of the blue light passing through the at least one red fluorescent substance area is substantially the same as a quantity of the blue light passing through the at least one yellow fluorescent substance area.

* * * * *